United States Patent [19]
Elliott et al.

[11] Patent Number: 5,690,877
[45] Date of Patent: Nov. 25, 1997

[54] METHOD OF PROCESSING A SEMICONDUCTOR CHIP PACKAGE

[76] Inventors: Alex Elliott, 2828 S. Calle Rosa Cir., Mesa, Ariz. 85202; Allen Koesser, 4421 E. Frye Rd., Phoenix, Ariz. 85044

[21] Appl. No.: 405,563

[22] Filed: Mar. 16, 1995

Related U.S. Application Data

[63] Continuation of Ser. No. 767,593, Sep. 30, 1991, abandoned.

[51] Int. Cl.⁶ .................. B29C 33/44; B29C 45/40
[52] U.S. Cl. .............. 264/161; 264/138; 264/272.17; 264/334
[58] Field of Search .................. 264/138, 155, 264/272.11, 272.15, 272.17, 276, 317, 334, 328.9, 161

[56] References Cited

U.S. PATENT DOCUMENTS

| | | | |
|---|---|---|---|
| 3,539,675 | 11/1970 | Hugill | 264/276 |
| 4,109,373 | 8/1978 | Fennessy et al. | 264/272.17 |
| 4,451,973 | 6/1984 | Tateno et al. | 264/272.17 |
| 4,501,540 | 2/1985 | Kako et al. | 264/276 |
| 4,504,427 | 3/1985 | Moyer | 264/317 |
| 4,592,131 | 6/1986 | Deie | 264/276 |
| 4,615,857 | 10/1986 | Baird | 264/272.17 |
| 4,778,146 | 10/1988 | Olla et al. | 264/272.17 |
| 4,862,586 | 9/1989 | Osada | 264/272.17 |
| 4,874,722 | 10/1989 | Bednary et al. | 264/276 |
| 4,915,607 | 4/1990 | Medders et al. | 264/272.17 |
| 4,916,518 | 4/1990 | Yoshimura | 264/272.17 |
| 4,946,518 | 8/1990 | Spanjer et al. | 264/272.17 |

FOREIGN PATENT DOCUMENTS

| | | |
|---|---|---|
| 0090503 | 3/1983 | European Pat. Off. . |
| 0330512 | 8/1989 | European Pat. Off. . |
| 0397320 | 11/1990 | European Pat. Off. . |
| 61-47658 | 3/1986 | Japan . |
| 62-128163 | 5/1987 | Japan . |

*Primary Examiner*—Angela Oritz
*Attorney, Agent, or Firm*—Miriam Jackson

[57] ABSTRACT

A method of removing dam bars (15) from leads (17) of a semiconductor chip package (10) is performed by first breaking a bond between the dam bars (15) and excess mold compound (12) from a mold compound (11). The bond is broken by slight movement of the dam bar (15). Thereafter, the dam bar (15) is completely removed by moving the dam bar (15) further, without causing chips or cracks in the mold compound (11).

14 Claims, 1 Drawing Sheet

-PRIOR ART- 4,690,877

METHOD OF PROCESSING A SEMICONDUCTOR CHIP PACKAGE

This application is a continuation of prior application Ser. No. 07/767,593, filed Sep. 30, 1991 now abandoned.

BACKGROUND OF THE INVENTION

This invention relates, in general, to processing of semiconductor packages, including, but not limited to, a method of removing dam bars from the leads of a semiconductor chip package.

Some semiconductor chips or integrated circuits are packaged by bonding the chip to a leadframe having leads. The leadframe is then encapsulated by a mold compound typically comprised of a plastic. Before encapsulation, dam bars are formed on the leads near the portion of the lead frame which is to be encapsulated. During the encapsulation process, mold compound fills the area between the leads up to the dam bars. The dam bars act to stop or prevent the mold compound from flowing out between the leads past the dam bars. However, a small portion of excess mold compound is formed on the lead adjacent the area on which the semiconductor chip is bonded on the lead frame. The dam bars also keep the leads coplanar and properly aligned during the assembly process.

In the past, the dam bars and the excess mold compound were simultaneously removed after encapsulation. The removal of both the dam bar and the excess mold compound was done simultaneously by mechanically pushing on a portion of the dam bar and a portion of the excess mold compound away from the leads. This was typically done with a tool called a punch. A disadvantage of this method was that cracks or chips may be created on the adjacent mold compound. Upon plating of the leadframe thereafter, plating and/or solder materials entered the cracks in the mold compound between the leads, which potentially caused reliability problems or electrical failures. Thus, it would be desirable to process the semiconductor chip package without creating cracks or chips in the mold compound.

Another method of removing the dam bars and the excess mold compound entails using a laser trimming system. This laser trimming system may prevent cracks or chips to the adjacent mold compound, however, it is much more complicated and expensive to use. It would be desirable to prevent chipping or cracking of the mold compound by using a less costly method.

SUMMARY OF THE INVENTION

In accordance with the present invention, a method of processing a semiconductor chip package is disclosed. This chip package has a dam bar formed on a lead and excess mold compound abutting the dam bar. The dam bar and excess mold compound form a bond. In the present invention, the dam bar is removed by first moving the dam bar in a manner in which the bond between the dam bar and the excess mold compound is broken and then the dam bar is moved further to completely remove the dam bar from the lead.

DETAILED DESCRIPTION OF THE DRAWINGS

Figure 1:
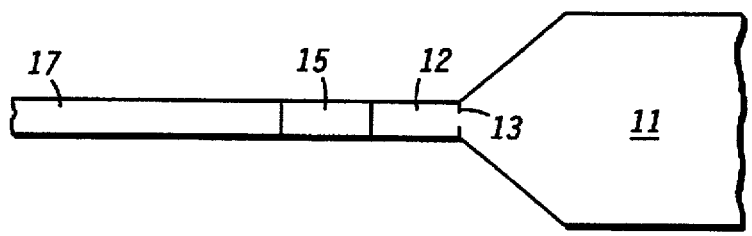
FIG. 1 illustrates a side-view of an embodiment of a semiconductor chip package to be processed in the present invention.

FIG. 1 illustrates a side-view of a semiconductor package 10 which is to be processed in the present invention. What is shown is a simplified drawing of a semiconductor package 10 wherein a mold compound 11 encapsulates a lead frame having at least one lead 17. During the encapsulation, excess mold compound 12 is formed between portions of lead 17. The distinction between excess mold compound 12 and mold compound 11 is illustrated by dotted line 13 for convenience only. A dam bar 15 is formed as a part of lead 17 in order to maintain lead coplanarity and to prevent excess mold compound 12 from being formed past dam bar 15. The encapsulation process described above is well known in the art.

Figure 2:
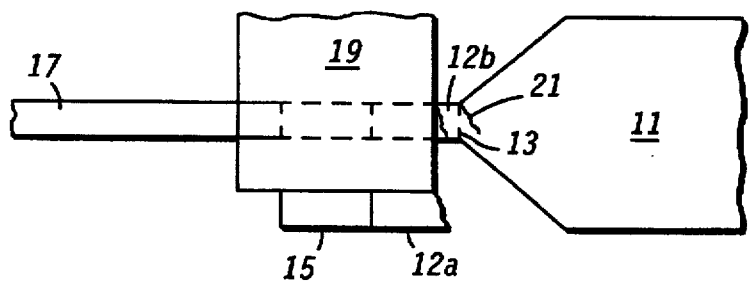
FIG. 2 illustrates a side-view of a semiconductor package processed according to the prior art.

FIG. 2 illustrates a side-view of semiconductor package 10 shown in FIG. 1 processed according to a prior art method. In this method, a mechanical tool called a punch 19 is used to "punch" out dam bar 15 and a portion of excess mold compound 12a simultaneously. During this process, excess mold compound 12 is broken into portion 12a removed from lead 17 and a portion 12b which remains on lead 17 attached to mold compound 11. During this process, chips and or cracks 21 may be formed in mold compound 11. During subsequent plating of lead 17, plating and/or other solder materials may be formed in crack 21 causing reliability problems or electrical failures in the semiconductor chip encapsulated by mold compound 11.

Figure 3:
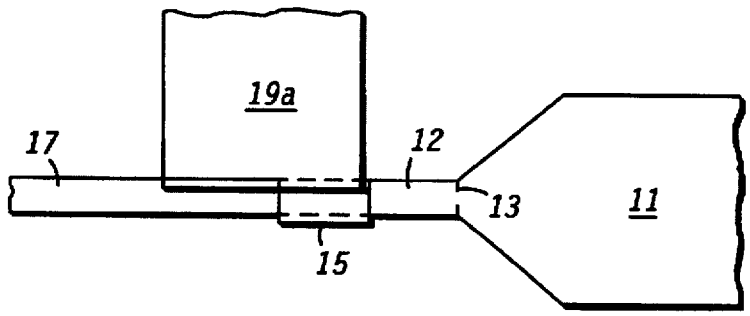
FIG. 3 illustrates a side-view of a semiconductor package processed according to an embodiment of the present invention in a beginning stage of processing.

FIG. 3 illustrates semiconductor package 10 of FIG. 1 processed according to an embodiment of the present invention in a beginning stage of processing. A punch 19a is also used in the present invention. However, in the present invention, punch 19a is used only to move dam bar 15 so that a bond between dam bar 15 and excess mold compound 12 is broken while semiconductor package 10 is in a first position. This slight movement may also be performed by other mechanical tools. A movement by punch 19a of a predetermined percentage of the thickness of dambar 15 is necessary to break the bond between dam bar 15 and excess mold compound 12. This predetermined percentage may be, for example, between approximately 30 and 50 percent of the thickness of dam bar 15.

Figure 4:
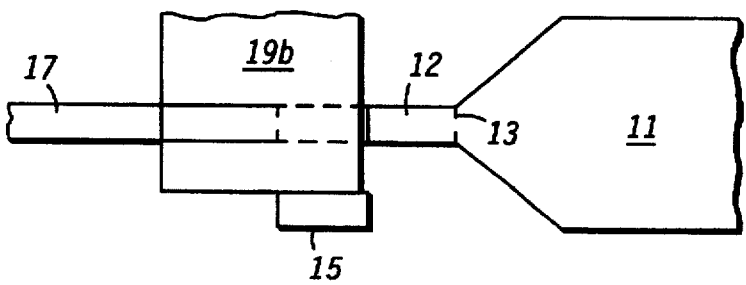
FIG. 4 illustrates the semiconductor chip package processed according to an embodiment of the present invention in a further stage of processing.

FIG. 4 illustrates the structure of FIG. 3 further along in processing. Semiconductor package 10 is moved to a second position, then dam bar 15 is completely removed by a punch 19b by moving dam bar 15 further away from lead 17. In the present invention, excess mold compound 12 is left undamaged. Thus, no cracks or chips are created in mold compound 11. Excess mold compound 12 may remain on lead 17 without hindering the performance of the semiconductor chip housed in semiconductor package 10. Currently, two punches, 19a and 19b, must be used because each punch may only move to one level. However, it is possible that the capability to have one punch move to a first level, then to a second level while semiconductor package 10 remains in one position will be developed. It is, however, important to note that in the present invention, dam bar 15 is removed using at least two movements of dam bar 15 rather than one continuous movement.

As can be readily seen, upon processing a semiconductor package according to the present invention a dam bar can be removed from a lead of a semiconductor package without having cracks or chips formed in the mold compound which may subsequently cause reliability problems or electrical failures.

A slight movement of dam bar 15 to break the bond between dam bar 15 and excess mold compound 12 prevents the formation of chips or cracks upon subsequently completely removing dam bar 15 from lead 17.

What is claimed is:

1. A method of processing a semiconductor chip package, comprising the steps of:

providing the semiconductor chip package having a lead and encapsulated by a mold compound, the lead having a dam bar formed thereon and having an excess mold compound abutting the dam bar wherein the dam bar and the excess mold compound form a bond;

moving the dam bar to a first level wherein the dam bar is not removed from the lead after the step of providing the semiconductor chip package;

stopping the act of moving; and moving the dam bar to a second level wherein the dam bar is removed from the lead and excess mold compound remains which prevents cracks from being formed in the mold compound.

2. The method of claim 1 wherein the step of moving the dam bar to the first level and to the second level is performed by a punch.

3. The method of claim 1 wherein the step of moving the dam bar to the first level comprises moving the dam bar to the first level equal to 30–50% of the thickness of the dam bar.

4. The method of claim 2 wherein the step of moving the dam bar to a first level is performed by a first mechanical tool and the step of moving the dam bar to a second level is performed by a second mechanical tool.

5. The method of claim 1 further comprising placing the semiconductor chip package in a first position before the step of moving the dam bar to the first level and moving the semiconductor chip package to a second position before the step of moving the dam bar to a second level.

6. A method of processing a semiconductor chip package, comprising the steps of:

providing the semiconductor package having a plurality of leads and encapsulated by a mold compound, the plurality of leads each having a dam bar formed thereon and having an excess mold compound adjacent the dam bar, wherein the dam bar and the excess mold compound form a bond; and non-continuously moving the dam bar to a first level and then a second level, wherein the first level is where the bond between the dam bar and the excess mold compound is broken, and the second level is where the dam bar is removed from the plurality of leads and excess mold compound remains which prevents cracks from being formed in the mold compound.

7. The method of claim 6 wherein the step of moving the dam bar to the first level and to the second level is performed by a punch.

8. The method of claim 6 wherein the step of moving the dam bar to the first level comprises moving the dam bar to the first level equal to 30–50% of the thickness of the dam bar.

9. The method of claim 6 wherein the step of moving the dam bar to a first level is performed by a first mechanical tool and the step of moving the dam bar to a second level is performed by a second mechanical tool.

10. The method of claim 6 further comprising placing the semiconductor chip package in a first position before the step of moving the dam bar to the first level and moving the semiconductor chip package to a second position before the step of moving the dam bar to a second level.

11. A method of removing dam bars from leads of a semiconductor chip package, comprising the steps of:

providing a semiconductor chip package having a plurality of leads;

providing a dam bar in between the plurality of leads;

encapsulating a portion of the leads with a mold compound, wherein the mold compound is adjacent the dam bar;

moving a mechanical tool to a first level to move the dam bar so that the dam bar is not completely removed from the plurality of leads after the step of encapsulating the portion of the leads;

stopping the movement of the mechanical tool; and moving a mechanical tool to a second level to move the dam bar so that the dam bar is removed from the plurality of leads and cracks are prevented from being formed in the mold compound.

12. The method of claim 11 wherein the step of moving a mechanical tool to a first level and a second level comprises moving a punch.

13. The method of claim 11 wherein the step of moving the mechanical tool to a first level comprises moving the dam bar to the first level equal to 30–50% of the thickness of the dam bar.

14. The method of claim 11 further comprising placing the semiconductor chip package in a first position before the step of moving a mechanical tool to the first level and moving the semiconductor chip package to a second position before the step of moving a mechanical tool to a second level.

* * * * *